(12) United States Patent
Mitard

(10) Patent No.: US 9,991,261 B2
(45) Date of Patent: Jun. 5, 2018

(54) GATE-ALL-AROUND NANOWIRE DEVICE AND METHOD FOR MANUFACTURING SUCH A DEVICE

(71) Applicant: IMEC VZW, Leuven (BE)

(72) Inventor: Jerome Mitard, Bossut-Gottechain (BE)

(73) Assignee: IMEC vzw, Leuven (BE)

( * ) Notice: Subject to any disclaimer, the term of this patent is extended or adjusted under 35 U.S.C. 154(b) by 0 days. days.

(21) Appl. No.: 15/221,396

(22) Filed: Jul. 27, 2016

(65) Prior Publication Data
US 2017/0040321 A1 Feb. 9, 2017

(30) Foreign Application Priority Data

Aug. 6, 2015 (EP) ..................................... 15179950

(51) Int. Cl.
*H01L 27/092* (2006.01)
*B82Y 10/00* (2011.01)
(Continued)

(52) U.S. Cl.
CPC ............ *H01L 27/092* (2013.01); *B82Y 10/00* (2013.01); *B82Y 40/00* (2013.01);
(Continued)

(58) Field of Classification Search
CPC ................ H01L 27/092; H01L 29/0673; H01L 29/0669; H01L 29/0665; H01L 29/78696; H01L 29/42392
See application file for complete search history.

(56) References Cited

U.S. PATENT DOCUMENTS

2008/0237575 A1 10/2008 Jin et al.
2010/0164102 A1 7/2010 Rachmady et al.
(Continued)

FOREIGN PATENT DOCUMENTS

WO WO 2013/103492 A1 7/2013
WO WO 2014/018201 A1 1/2014
(Continued)

OTHER PUBLICATIONS

European Search Report dated Feb. 5, 2016 in Application No. EP 15179950, 10 pages.

*Primary Examiner* — Marcos D Pizarro
*Assistant Examiner* — Shannon Yi
(74) *Attorney, Agent, or Firm* — Knobbe, Martens, Olson & Bear LLP

(57) ABSTRACT

The disclosed technology generally relates to a semiconductor device, and more particularly to a gate all around (GAA) semiconductor device and a method for fabricating the same. In one aspect, a semiconductor device has a vertical stack of nanowires formed on a substrate, wherein the vertical stack of nanowires comprises an n-type nanowire and a p-type nanowire each extending in a longitudinal direction parallel to a main surface of the substrate. The n-type nanowire comprises a first material and the p-type nanowire comprises an inner part having two sides and an outer part at each side of the inner part in the longitudinal direction, wherein one or both of the two outer parts comprises a second material different from the first material. The n-type nanowire and the p-type nanowire each comprises a channel region electrically coupled to respective source and drain regions. The channel region of the p-type nanowire comprises the inner part. The device additionally includes a shared gate structure circumferentially surrounding the channel regions of the n-type and p-type nanowires.

9 Claims, 10 Drawing Sheets

(51) Int. Cl.
  *B82Y 40/00*     (2011.01)
  *H01L 29/66*     (2006.01)
  *H01L 29/775*    (2006.01)
  *H01L 29/06*     (2006.01)
  *H01L 29/08*     (2006.01)
  *H01L 29/165*    (2006.01)
  *H01L 21/8238*   (2006.01)
  *H01L 29/423*    (2006.01)
  *H01L 29/786*    (2006.01)

(52) U.S. Cl.
  CPC .... *H01L 21/823807* (2013.01); *H01L 29/068* (2013.01); *H01L 29/0673* (2013.01); *H01L 29/0847* (2013.01); *H01L 29/165* (2013.01); *H01L 29/42392* (2013.01); *H01L 29/66439* (2013.01); *H01L 29/66742* (2013.01); *H01L 29/775* (2013.01); *H01L 29/78651* (2013.01); *H01L 29/78684* (2013.01); *H01L 29/78696* (2013.01)

(56) References Cited

U.S. PATENT DOCUMENTS

| | | | |
|---|---|---|---|
| 2010/0187503 A1 | 7/2010 | Moriyama et al. | |
| 2010/0295021 A1* | 11/2010 | Chang | H01L 27/1203 257/24 |
| 2011/0254013 A1* | 10/2011 | Xiao | H01L 21/84 257/76 |
| 2014/0209864 A1 | 7/2014 | Bangsaruntip et al. | |
| 2015/0372119 A1* | 12/2015 | Zhang | B82Y 10/00 438/268 |
| 2016/0027929 A1* | 1/2016 | Cheng | H01L 29/78696 257/9 |
| 2017/0053998 A1* | 2/2017 | Kim | H01L 29/66553 |

FOREIGN PATENT DOCUMENTS

| | | |
|---|---|---|
| WO | WO 2015/094239 A1 | 6/2015 |
| WO | WO 2015/094301 A1 | 6/2015 |

\* cited by examiner

US 9,991,261 B2

GATE-ALL-AROUND NANOWIRE DEVICE AND METHOD FOR MANUFACTURING SUCH A DEVICE

CROSS-REFERENCE TO RELATED APPLICATIONS

This application claims foreign priority to European Application No. EP 15179950.9, filed Aug. 6, 2015, the content of which is incorporated by reference herein in its entirety.

BACKGROUND

Field

The disclosed technology generally relates to a semiconductor device, and more particularly to a gate all around (GAA) semiconductor device and a method of fabricating the same.

Description of the Related Technology

Increasing chip density is the workhorse of the semiconductor industry. Among other trends, one trend in the semiconductor industry is a shift from planar devices to devices utilizing fully-depleted and/or three dimensional architectures, such as FinFET devices. However, as FinFET devices start to face their own challenges associated with scaling to advanced technology nodes, e.g., 10 nm technology node and beyond, including performance challenges arising from parasitic capacitances and resistances and processing challenges arising from advancedpatterning, devices having alternative architectures and structures are being explored. One device being explored is gate-all-around (GAA) nanowire (NW) devices, which are promising candidates for replacing FinFET devices in future technology generations, in part due to their superior electrostatic and gate control. For example, it has been noted that channel lengths can be more aggressively scaled in a GAA NW device compared to FinFET devices. In addition, an undoped channel may be used in a GAA NW device, thereby reducing the threshold voltage variation between devices. Furthermore, to achieve higher layout efficiency and device density, GAA NW devices may be vertically stacked.

Patent application WO2014018201 A1 describes a nanowire transistor device and a method for manufacturing such a nanowire transistor device. The manufacturing technique is based on the so-called top down approach which involves nanowire fabrication using a CMOS compatible technology, such as lithography-based patterning and etching. The CMOS integration scheme in WO2014018201 uses two distinct stacks for nFET and for pFET. The p-type layer stack is manufactured completely independent of the process for the n-type layer stack. The nFET stack and the pFET stack are arranged independently aside of one another.

Thus, there is a need to provide a more compact GAA NW device.

SUMMARY OF CERTAIN INVENTIVE ASPECTS

A first aspect relates to a nanowire semiconductor device.

A second aspect relates to a method for manufacturing a nanowire semiconductor device.

It is an aim of the present disclosure to provide a compact and dense nanowire semiconductor device and a method for manufacturing such device with a minimum of processing steps.

The nanowire semiconductor device according to a first aspect comprises a semiconductor substrate having a main surface; a vertical stack of nanowires on the substrate; the nanowires having a longitudinal direction parallel to the main surface; the vertical stack comprising at least a first-type nanowire and at least a second-type nanowire. The first-type nanowire comprises a first material. The second-type nanowire comprises in its longitudinal direction an inner part and two outer parts at each side of the inner part and at least one of the two outer parts comprises a second material different from the first material. The two outer parts are thus located near the end of the nanowire (an outer part near each end). The first-type nanowire and second-type nanowire comprise a channel region being electrically coupled to a respective source and drain region, the channel region of the second-type nanowire comprising at least the inner part of the second-type nanowire. The nanowire semiconductor device further comprises a shared gate structure disposed circumferentially around the channel regions of the first-type and second-type nanowires.

It is an advantage a compact asymmetric nanowire device is provided where only a left part or a right side part of the nanowire (intended to form the second-type nanowires 1102) comprises the second material 160. This may be advantageous for example for tunnel FET devices which have opposite conductive types for source and drain regions.

It is an advantage of the device according to the present disclosure that different materials may be integrated in a stacked configuration thereby allowing very compact design. Different materials allow for different mobilities in the device.

It is an advantage of the device according to the present disclosure that by stacking transistors comprising different materials device space is gained. More specifically in SRAM cell, there is a gain in stack height up to factor 2.

It is an advantage of the device according to the present disclosure that a gate-all around (GAA) nanowire-based CMOS device is provided which has ideal electrostatics and short channel control and thus enables Vt/Vdd (threshold voltage versus drain voltage) scaling.

According to embodiments the two outer parts aside of the inner part of the second-type nanowires comprise the second material different from the first material.

According to embodiments also the inner part of the second-type nanowire comprises the second material, the channel region of the second-type nanowire also comprising the outer parts of the second-type nanowire.

It is an advantage of the device according to the present disclosure that by stacking transistors of opposite polarity device space is gained. More specifically in SRAM cell, there is a gain in stack height up to factor 2.

It is an advantage of the device according to the present disclosure that different conductive types, such as both pMOS and nMOS, may be integrated in a stacked configuration thereby allowing very compact design.

According to embodiments the first material comprises Si or $SiGe_q$ with $0<=q<=1$.

According to embodiments the second material comprises $SiGe_z$ with $0<z<=1$. For embodiments wherein the first-type nanowire(s) comprises $SiGe_q$ with $0<=q<=1$, the Ge content of the second material should be higher than the Ge content of the substrate, thus $z>q$.

It is an advantage of the device according to the present disclosure that Si and a high mobility material such as SiGe are combined in a stacked CMOS. A high mobility channel material enables higher drive currents.

It is an advantage of the device according to the present disclosure that an undoped channel region may be used. There is thus no need for additional doping of the channel region.

According to embodiments the nanowire semiconductor device comprises a semiconductor substrate having a main surface; a vertical stack of nanowires on the substrate; the nanowires having a longitudinal direction parallel to the main surface; the vertical stack comprising at least a first-type nanowire and at least a second-type nanowire. The first-type nanowire comprises a first material. The second-type nanowire comprises an inner part and two outer parts at each side of the inner part and the two outer parts comprises a second material different from the first material. The first-type nanowire and second-type nanowire comprise a channel region being electrically coupled to a respective source and drain region, the channel region of the second-type nanowire comprising at least the inner part of the second-type nanowire. The nanowire semiconductor device further comprises a shared gate structure disposed circumferentially around the channel regions of the first-type and second-type nanowires.

According to embodiments a top part near the main surface of the semiconductor substrate comprises an oxide.

It is an advantage of the device according to the present disclosure that it comprises an improved channel isolation.

It is an advantage of the device according to the present disclosure that it comprises an improved channel isolation without the need for using expensive semiconductor-on-insulator substrates.

According to embodiments the device has a gate length $L_G$ which is smaller than 40 nanometers, more preferably smaller than 20 nanometers.

According to embodiments the source and drain region coupled with the first-type nanowire comprise a mobility enhancing material, and the source and drain region coupled with the second-type nanowire comprise another mobility enhancing material. The mobility enhancing material for the first-type nanowire comprising Si may for example be SiGe or a III-V material such as Si:C or InAs. The another mobility enhancing material may comprise SiGe.

It is an advantage of the device according to the present disclosure that it comprises source/drain regions which further enhance the mobility of the device.

According to embodiments the gate structure may comprise a metal. The metal may be, for example, TiN, TaN or W.

It is an advantage of the device according to the present disclosure that polydepletion is eliminated and carrier mobility is enhanced by using a metal gate in comparison with polysilicon gate stacks.

It is an advantage of the device according to the present disclosure that it comprises a common metal gate for both n-type and p-type transistors instead of the need for different metal gate (materials) for n-type and p-type respectively.

According to embodiments the first-type and second-type nanowires are connected to one another at their ends with an inner dielectric spacer; the inner dielectric spacer being in between the nanowires and aside (at both sides) of the shared gate structure.

It is an advantage of the device according to the present disclosure that the nanowires are better anchored and more stable using inner spacers.

According to embodiments the nanowire (first-type and/or second-type) may be a junction-less transistor nanowire, which means there is no gate junction (i.e. no junction in between source/drain and channel region). The junction-less nanowire (which according to this embodiments forms the channel region) is heavily doped (p- or n-type) over the complete nanowire.

It is an advantage of a junction-less nanowire that the nanowire is completely doped before the conversion step, which means no doping is needed to be performed after the conversion step.

According to embodiments the second-type nanowire is formed by fabricating the nanowire in the first material, providing a conversion material at at least one of the two ends of the nanowire and converting the first material of at least the corresponding outer part of the nanowire into the second material using the conversion material.

According to embodiments the second-type nanowire is formed by fabricating the nanowire in the first material, providing a conversion material at the ends of the nanowire and converting the first material of the outer parts of the nanowire into the second material using the conversion material.

According to embodiments the second-type nanowire is formed by a germanium (Ge) condensation process by intermixing the conversion material into the first material thereby forming the second material.

The method for manufacturing a nanowire semiconductor device according to a second aspect comprises fabricating a vertical stack of alternating nanowires and interlayer nanowires, the nanowires comprising a first material and the interlayer nanowires comprising an interlayer material different from the first material; the nanowires having a longitudinal direction parallel to the main surface and having two ends at opposite sides of the nanowire in its longitudinal direction; the nanowires intended to form at least a first-type nanowire and at least a second-type nanowire. The method further comprising selectively providing at one of the two ends of the nanowire intended to form a second-type nanowire a conversion material different from the first material for allowing the first material of the nanowire intended to form a second-type nanowire to be converted into a second material. The method further comprising removing the interlayer nanowires; and thereafter converting the first material of at least one of the two outer parts corresponding to the one of the two ends of the nanowire intended to form the second-type nanowire into the second material, thereby converting the nanowire into the second-type nanowire while a not converted nanowire forms the first-type nanowire; and fabricating a shared gate structure around the first-type and second-type nanowires.

It is an advantage of the method according to the present disclosure that the method enables accurate positioning of the nanowire device across the wafer by using a top down approach. The top down approach also facilitates ultra-large-scale-integration for high performance integrated circuits.

According to embodiments the conversion material may be provided only at one side of the nanowires (intended to form the second-type nanowires) or at both sides of the nanowires (intended to form the second-type nanowires). This has the advantage of the possibility to form an asymmetric nanowire device where only a left part or a right side part of the nanowire (intended to form the second-type nanowires) is converted into the second material or a symmetric device. An asymmetric conversion may be advantageous for example for tunnel FET devices which have opposite conductive types for source and drain regions.

According to embodiments fabricating the vertical stack of nanowires comprises providing a stack of alternating layers on the main surface of the substrate; providing a sacrificial gate and sacrificial spacers aside of the sacrificial gate on the stack of alternating layers; etching the stack of alternating layers using the sacrificial gate and sacrificial spacers as patterning mask.

According to embodiments the method further comprises fabricating a source and drain region at the two ends of the nanowire intended to form the first-type nanowire and fabricating a source and drain region at the two ends of the second-type nanowire.

According to embodiments before removing the interlayer nanowires, a protective material is provided at the two ends of nanowires intended to form the first-type nanowire.

According to embodiments the method further comprises before removing the interlayer nanowires, encapsulating the vertical stack of nanowires, the spacer material and the conversion material with a dielectric material. The dielectric material preferably comprises oxygen such as $SiO_2$.

According to embodiments the method converting the first material of the nanowire intended to form the second-type nanowire into the second material comprises annealing the device. Annealing the device comprises oxidizing the first material of the nanowire intended to form the second-type nanowire and intermixing of the conversion material into the first material thereby forming the second material.

According to embodiments the first material comprises Si or $SiGe_q$ with $0<=q<=1$.

According to embodiments the conversion material comprises $SiGe_y$ with $0<y<=1$.

According to embodiments the interlayer material comprises $SiGe_x$ with $0<x<=1$. For embodiments wherein the conversion material is covering both the nanowires intended to be converted into second-type nanowires and the interlayer nanowires, x should be different from y, which means that the Ge content for the nanowires intended to be converted into second-type nanowires and the interlayer nanowires should be different. This is of importance to ensure etch selectivity when the interlayer nanowires are removed. For embodiments wherein the substrate comprises $SiGe_p$ with $0<=p<=1$, x should be different from p, which means the Ge content of the substrate and the interlayer nanowires should be different to ensure etch selectivity when removing the interlayer nanowires.

According to embodiments the second material comprises $SiGe_z$ with $0<z<=1$ and $z<y$. this means the Ge content of the converted material (i.e. the second material) should be lower than the Ge content of the conversion material. For embodiments wherein the first material comprises $SiGe_q$ with $0<=q<=1$, the Ge content of the second material should be higher than the Ge content of the substrate, thus $z>q$.

Depending on the strain requirements (compressive or tensile) of the device (of the p and/or n-transistor of the stacked semiconductor device) a person skilled in the art may adapt the Ge concentrations of the different materials comprising SiGe (i.e. substrate, first material, conversion material, interlayer material) accordingly.

According to embodiments the method further comprises after removing the interlayer nanowires anchoring the nanowires with inner dielectric spacers. The anchoring may be done but before converting the first material or after converting the first material.

According to embodiments the method further comprises that a top part near the main surface of the semiconductor substrate is oxidized during annealing the device.

According to an inventive aspect a method for manufacturing a nanowire semiconductor device is disclosed, the method comprising providing a patterned structure on a main surface of a semiconductor substrate; the patterned structure comprising a vertical stack of alternating Si and $SiGe_x$ nanowires with $0<x<=1$; the nanowires having a longitudinal direction parallel to the semiconductor main surface and having two ends at opposite sides of the nanowire in its longitudinal direction; selectively providing $SiGe_y$ at the two ends of a second set of nanowires. For embodiments wherein the conversion material is covering both the nanowires intended to be converted into second-type nanowires and the interlayer nanowires, x should be different from y, which means that the Ge content for the nanowires intended to be converted into second-type nanowires and the interlayer nanowires should be different. This is of importance to ensure etch selectivity when the interlayer nanowires are removed. The method further comprising removing the $SiGe_x$ nanowires from the vertical stack; and thereafter annealing the nanowires thereby driving $SiGe_y$ into the nanowires intended to be converted into second-type nanowires and thereby converting the nanowires intended to be converted into second-type nanowires into $SiGe_z$ nanowires, with $0<z<=1$ and $z<y$, while a first set of nanowires remain Si nanowires; providing a gate stack around the first set of Si nanowires and second set of $SiGe_z$ nanowires; providing a first source and first drain region at the ends of the converted $SiGe_z$ nanowires; and providing a second source and second drain region at the ends of the second set of Si nanowires.

It is an advantage of the device according to the present disclosure that scaling is possible to technology nodes below 1× nm while using standard process steps.

Figure 1:
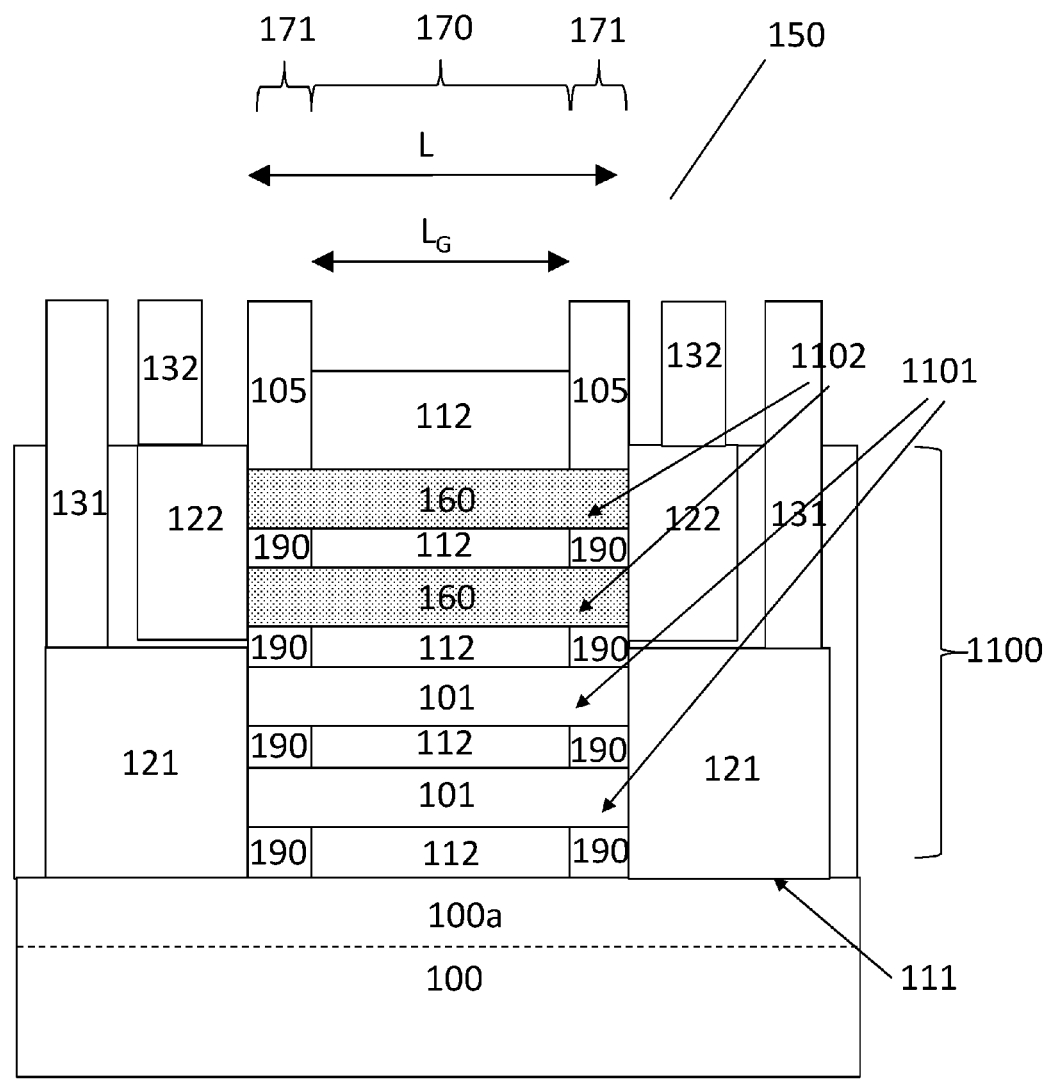
FIG. 1 schematically illustrates a nanowire semiconductor device according to embodiments.

The drawings are only schematic and are non-limiting. In the drawings, the size of some of the elements may be exaggerated and not drawn to scale for illustrative purposes. The dimensions and the relative dimensions do not necessarily correspond to actual reductions to practice of the disclosure.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The disclosure will be further elucidated by means of the following detailed description of several embodiments of the disclosure and the appended figures.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

"Horizontal" refers to a general direction along or parallel to a primary surface of a substrate, and "vertical" is a direction generally orthogonal thereto. "Horizontal" and "vertical" are used as generally perpendicular directions relative to each other independent of the orientation of the substrate in the three-dimensional space.

In the following, certain embodiments will be described with reference to a silicon (Si) substrate, but it should be understood that they apply equally well to other semiconductor substrates. In embodiments, the "substrate" may include a semiconductor substrate such as e.g. a silicon, a germanium (Ge), or a silicon germanium (SiGe) substrate, a gallium arsenide (GaAs), a gallium arsenide phosphide (GaAsP), an indium phosphide (InP). The "substrate" may include for example, an insulating layer such as a $SiO_2$ or a $Si_3N_4$ layer in addition to a semiconductor substrate portion. Thus, the term substrate also includes silicon-on-insulator (SOI) substrates, e.g., silicon-on-glass or silicon-on-sapphire substrates. The term "substrate" is thus used to define generally the elements for layers that underlie a layer or portions of interest. Also, the "substrate" may be any other base on which a layer is formed, for example a glass or metal layer. Accordingly a substrate may be a wafer such as a blanket wafer or may be a layer applied to another base material, e.g. an epitaxial layer grown onto a lower layer.

The substrate preferably comprises a semiconductor material such as Si or Ge. The substrate can, for example, be formed of silicon, silicon on insulator, germanium on insulator.

As described herein, a "nanowire' refers to an elongated semiconductor structure having a ratio of a length in an elongation direction to a width (or a height depending on the geometry) in a direction orthogonal to the length direction that is greater than two. A nanowire can have a width that is less than about 100 nm, less than about 50 nm, or less than about 20 nm, according to various embodiments. A nanowire can have a circular, an elliptical or any polygonal cross-sectional shape, e.g., a rectangle or a square shape. Additionally, the terms "nanoribbon," "semiconductor wire" or "nanosheet" may be used. A nanoribbon refers to a nanowire having asymmetric height to width ratio, whereas a symmetric nanowire refers to a nanowire having equal height and width and thus has symmetric height to width ratio (i.e. 1 to 1). The nanowire may have a cylindrical shape, having a radius and a length. The terms nanowire and nanoribbon may be used interchangeable and the concepts and techniques described in this disclosure are equally applicable to both geometries. A nanosheet refers to a rectangular shaped nanowire with a length, height and width. A semiconductor fin may also be patterned to form a nanowire (which is then square or rectangular shaped). A nanowire may further be fabricated in two geometries being lateral and vertical. A lateral nanowire has a lateral orientation towards the substrate or substrate surface. It may also be referred to as horizontal nanowire. A vertical nanowire has its orientation perpendicular or vertical towards the substrate or substrate surface. The nanowire referred to in the present disclosure refers to a lateral (or horizontal) nanowire and is not applicable for a vertical nanowire. The horizontal nanowires referred to in the present disclosure comprise two ends, one at each side of the nanowire.

Figure 2:
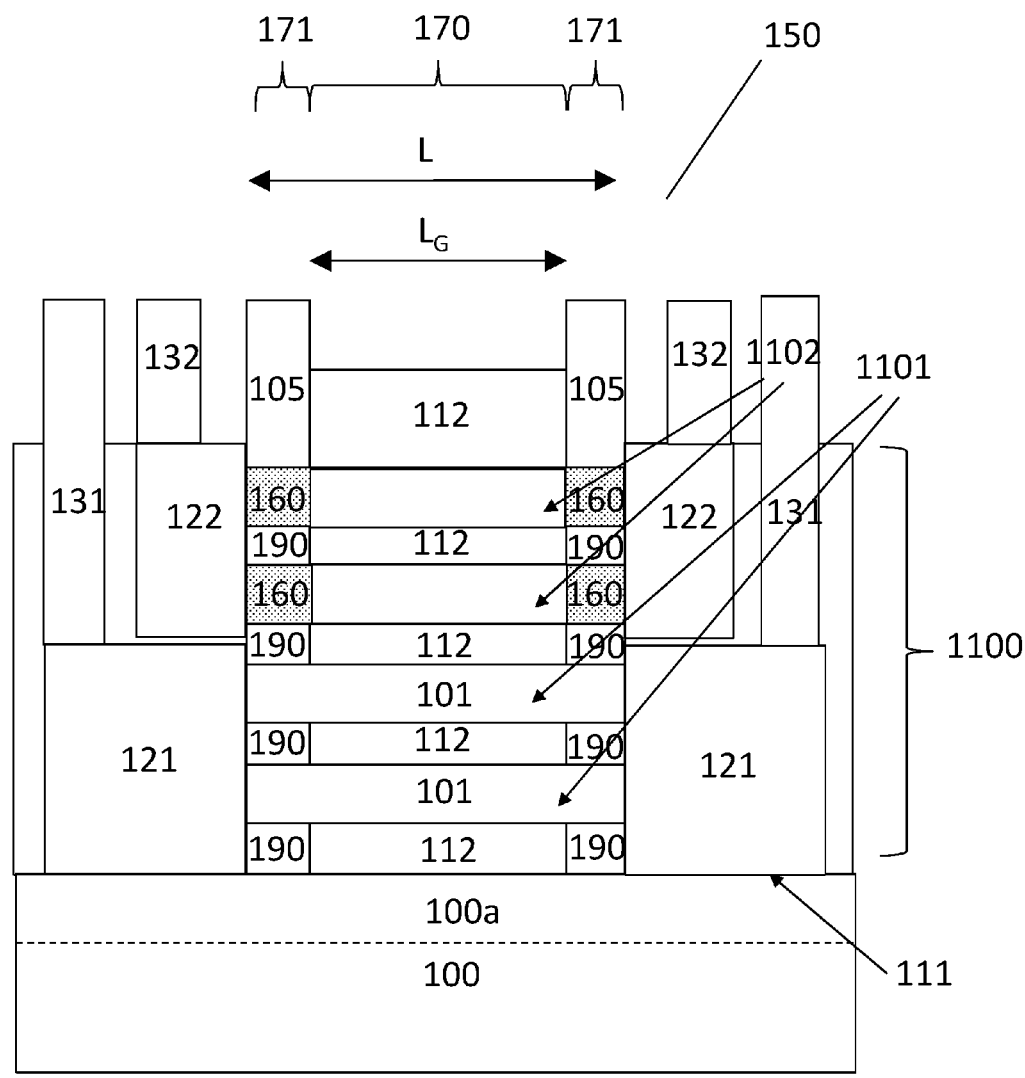
FIG. 2 schematically illustrates a nanowire semiconductor device according to embodiments.

Referring to FIG. 1 and FIG. 2 the nanowire semiconductor device 150 according to certain embodiments of the disclosure will now be explained.

The device comprises a semiconductor substrate 100. The substrate 100 preferably is a bulk Si substrate or a silicon-on-insulator substrate (SOI). A SOI substrate is a layered silicon-insulator-silicon substrate comprising a buried oxide (BOX) layer sandwiched in between a Si support layer and a Si device layer. The nanowire semiconductor device is manufactured in the Si device layer, which is the top layer of the SOI substrate.

It is an advantage of using a SOI substrate that the device is isolated by the buried oxide (BOX) layer of the SOI substrate from the support layer. Some benefits linked with SOI substrate are for example low leakage currents, latchup resistant, lower parasitic capacitance. A SOI substrate however also has the disadvantage of being very expensive (cost is about ten times more than bulk silicon wafers). SOI substrates also suffer from poor thermal conductivity, which makes heat dissipation from devices difficult.

The disclosure will now be explained with reference to a bulk semiconductor substrate. However, it will be understood that the embodiments may be implemented in any substrate described above. The substrate 100 comprises a main surface 111 which may also be referred to the top surface, being the primary surface of the substrate 100.

Throughout the disclosure there is referred to "first material", "second material" and "conversion material". The "first material" 101 refers to the material of the first-type nanowires 1101. The "second material" 160 refers to the material of the second-type nanowires 1102 (after conversion). The "second material" 160 is thus converted first material. The "conversion material" 106 refers to the material which is provided at the (both or only one of the two) ends of some nanowires (the nanowires intended to be converted into second-type nanowires) in order to convert "the first material" into "the second material".

The first-type or the second-type in turn may refer to the dopant type of the nanowire material. For example, one of the first-type or the second-type material can refer to one of a p-type or an n-type material, whereas the other of the first-type or the second-type material can refer to the other of the p-type or the n-type material.

According to embodiments, the substrate 100 comprises a top part 100a which comprises a semiconductor oxide, the semiconductor oxide being an oxidized part from the semiconductor substrate. The substrate 100 may for example comprise Si and the corresponding top part 100a may comprise $SiO_2$. By having an oxidized top part 100a of the semiconductor substrate 100 a local SOI-like structure is present in the device. This forms a parasitic channel isolation between the nanowires (channels) and the substrate, without the need of using an expensive SOI substrate.

The oxidized top part 100a of the semiconductor substrate 100 is formed during the step of converting the first material of the nanowires intended to form the second-type nanowires into the second material 106 as further described below. This converting step (more specifically Ge condensation) involves an annealing step which will influence the top part of the semiconductor substrate, which is more specifically oxidizing the top part 100a.

The device 150 further comprises a vertical stack 1100 of horizontal nanowires, the nanowires thus having their longitudinal direction parallel to the main surface 111. The nanowires of the vertical stack 1100 are intended to form at least a first-type nanowire 1101 and at least a second-type nanowire 1102. As will be clear further in the description a converted nanowire forms the second-type nanowire 1102, whereas a non-converted nanowire forms the first-type nanowire 1101.

The vertical stack thus comprises a substack of first-type nanowires 1101 and a substack of second-type nanowires 1102. The substack of first-type nanowires 1101 comprises at least one nanowire comprising a first material 101 and the substack of second-type nanowires 1102 comprises at least one nanowire comprising a second material 160, being different from the first material 101. Each substack 1101, 1102 may comprise one nanowire or more than one nanowire.

It is an objective of the present disclosure to combine nanowires comprising different materials in the same vertical stack of horizontal nanowires of a semiconductor device. The vertical stack of nanowires should thus at least comprise two nanowires, one nanowire comprising the first material and another nanowire comprising the second material, the second material being different from the first material. The number of nanowires that can be stacked may vary depending on the requirements for the device. By stacking more than two nanowires, the density of the semiconductor may be increased.

It is further an object of the present disclosure to combine both n-type nanowire transistors and p-type nanowire transistors in the same vertical stack of nanowires of a semiconductor device. The vertical stack of nanowires should thus at least comprise two nanowires, one for the n-type transistor (which may be the first-type nanowire) and the other for the p-type transistor (which may be the second-type nanowire).

Each nanowire 1101, 1102 comprises an inner part 170 and aside of the inner part 170 at each end of the nanowire an outer part 171. Each nanowire 1101, 1102 thus comprises two outer parts 171 (at the two ends of the nanowire) at each side of the inner part 170. As will be explained further according to embodiments the inner part 170 may form the channel region of the nanowire or according to alternative embodiments the inner part 170 and the outer parts 171 may form the channel region.

Each nanowire (first-type 1101 and second-type 1102) comprises a channel region being electrically coupled to source and drain regions 121,122. According to embodiments (where only the inner part forms the channel region) the nanowire may also comprise part of the source and drain region (which will coincide with the outer parts 171). According to alternative embodiments (where both inner part and outer parts form the channel region) the nanowires only comprise the channel region (which will thus coincide with the inner part 170 and the outer parts 171). In this case the source and drain region 121, 122 are present at both ends and aside of the nanowires, thus not being part of the nanowire.

According to various embodiments, the nanowire (first-type 1101 and/or second-type 1102) may be a junction-less nanowire configured for a junction-less nanowire transistor. As described herein, a junction-less transistor refers to a transistor in which the source/drain regions and the channel region do not form a semiconductor junction therebetween, as understood in the art to be formed between two oppositely doped semiconductor regions. In some embodiments, the nanowires of the first-type 1101 and/or the second-type 1102 are junction-less nanowires configured for junction-less nanowire transistors. Thus, according to embodiments, the junction-less nanowires are doped, e.g., heavily doped (p- or n-type) throughout the entire nanowire. It is an advantage of a junction-less nanowire that the nanowire is completely doped before the conversion step. Thus, no further doping is performed after the conversion step, according to embodiments.

The first-type nanowire 1101 comprises a first material 101. The channel region of the first-type nanowire 101 thus comprises the first material 101. A source and drain region 121 are electrically coupled at the sides of the first-type nanowire 101, preferably not being part of the nanowire. The channel region of the first-type nanowire 101 coincides thus substantially with the entire nanowire having a length L.

As described herein, a gate length $L_G$ refers to the physical length of the physical (wrapped) gate and covers part of the channel that is controlled by the gate. The effective channel length is determined due to the lateral diffusion of source and drain junctions (if junctions are present). The effective channel length is thus typically somewhat different than the gate length $L_G$ as source/drain junction do not coincide exactly with the boundaries of the physical gate.

In various embodiments, the gate length $L_G$ of the device is shorter than about 40 nm, or shorter than about 20 nm. In addition, when a cross-section of the channel region, which serves as an active area of the nanowire transistor, has a circular or an elliptical shape, the channel region has a diameter or a longest diameter that is less than about 10 nm, or between about 2 nm and about 10 nm. Alternatively, when a cross-section of the channel region has a rectangular or a rhomboidal shape, the channel region preferably has a cross-sectional side or the longest cross-sectional side that is less than about 10 nm or between about 2 nm and about 10 nm. In various embodiments, the nanowire length L does not exceed about 40 nm. Under some circumstances, when the nanowire length L is less than 40 nm, the converting process may become more challenging during the manufacturing of the device. For example, during a Ge condensation step (as described in more detail further below), it is desirable for the SiGe of the conversion material 106 to be driven in through an entire length of the second-type nanowire 1102. However, if the nanowire is too long, it is possible that the nanowire is not completely converted into the second material 106. However, in other circumstances, it may be tolerable or desirable to have a partial conversion across the length of the second-type nanowire 1102.

At least the outer parts 171 of the second-type nanowire 1102 comprise a second material 160 being different from the first material 101 (FIG. 2). According to embodiments also the inner part 170 of the second-type nanowire 1102 comprises the second material 160, i.e. the complete nanowire comprises the second material 160 (FIG. 1) or otherwise said the second-type nanowire 1102 is a result of a complete conversion of the first material 101 into the second material 160.

Whether only outer parts 171 of the second-type nanowire 1102 or also the inner part 170 of the second-type nanowire 1102 comprises the second material 160 depends on the conversion step, more specifically the Ge condensation step and the parameters used in this condensation step which is explained in more detail further in the description.

FIG. 1 gives a schematic representation wherein both inner part 170 and outer parts 171 have been converted and the second-type nanowire 1102 of the final device comprises over the entire nanowire length the second material 160. According to these embodiments the channel region of the second-type nanowire 1102 coincides with the nanowire.

FIG. 2 gives a schematic representation wherein only outer parts 171 have been converted and the second-type nanowire 1102 of the final device comprises only at the outer parts 171 the second material 160. The inner part comprises the first material 101 (which is thus not converted). According to this embodiment, the channel region of the second-type nanowire 1102 coincides only with the inner part of the nanowire. In this embodiment, the outer parts 171 comprising the second material 160 should be doped in order to form source/drain regions of the nanowire transistor. As an alternative, the channel region of the second-type nanowire coincides with the complete nanowire. In this alternative, the outer parts 171 comprising the second material 160 remain undoped and therefore also form part of the channel region of the nanowire transistor.

According to embodiments the first material 101 of the first-type nanowire 1101 comprises silicon (Si). The first-type nanowire 1101 may be doped or undoped as known for a person skilled in the art. The source/drain region 121 electrically coupled to the first-type nanowire 1101 may comprise materials known for a person skilled in the art for example Si or a mobility enhancing material such as Si:C, InAs, SiGe.

According to embodiments the second material 160 of the second-type nanowire 1102 comprises silicon germanium (SiGe$_z$ with 0<z<=1). The second material 160 may be doped or undoped. The source/drain region 122 electrically coupled to the second-type nanowire 1102 may comprise materials known for a person skilled in the art for example Si or a mobility enhancing material such as Si:C, InAs, SiGe.

The nanowires (first-type 1101 and second-type 1102) have a shared gate structure 112 disposed circumferentially around the channel regions of the nanowires. The shared gate stack (i.e. gate dielectric and gate electrode) thus surrounds the entire perimeter of each of the channel regions. The nanowire device 150 according to the present disclosure is thus a gate-all-around (GAA) or gate-wrap-around semiconductor device. The shared gate 112 comprises a gate dielectric layer and a gate electrode layer, the gate dielectric layer being sandwiched in between the channel region and the gate electrode layer (not shown). The gate dielectric may be any suitable dielectric such as high-k dielectrics (e.g., Hf-based dielectrics such as $HfO_2$ and HfLaO or other dielectrics such as $Al_2O_3$ and $SiO_2$). The gate electrode may be any suitable conductive layer such as polysilicon, metal (such as TiN, TaN).

According to embodiments the gate electrode comprises a metal such as TiN, TaN. It is an advantage of a metal gate electrode that polydepletion is eliminated and carrier mobility is enhanced by using a metal gate in comparison with polysilicon gate stacks.

Aside of the shared gate, on top of the stack 1100 of nanowires (thus on top of the last, top nanowire of the stack, the nanowire most far away from the substrate surface 111) spacers 105 are present. The spacers 105 may comprise any material suitable for a person skilled in the art, such as for example SiN, airgap.

According to embodiments, inner dielectric spacers 190 may be present in between the different nanowires 1101, 1102 aside (at both sides) of the shared gate 112 for anchoring the nanowires. The inner spacers preferably comprise a dielectric material such as SiN or $SiO_2$. The inner dielectric spacers 190 can comprise a different material with a different dielectric constant (k-value) than the gate spacers 105. The inner spacers 190 have the advantage to reduce the parasitic capacitance between the source/drain regions and the gate.

The source/drain regions 121, 122 are connected with source/drain contacts 131,132 to the middle-end-of-line (MEOL) of the device.

FIGS. 3 to 12 show a process flow of a method for manufacturing a nanowire semiconductor device according to embodiments of the disclosure.

Figure 3:
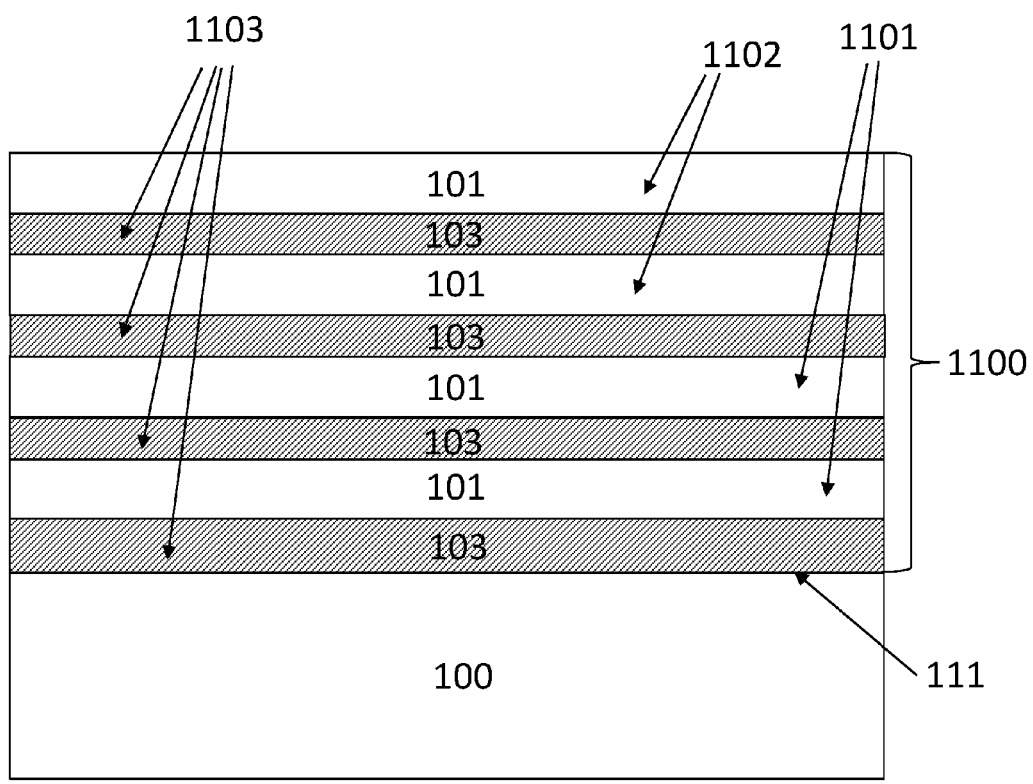
FIGS. 3 to 10 represent intermediate structures at various processing stages illustrating a method of fabricating a nanowire semiconductor device, according embodiments.

Referring to FIG. 3, the method starts with providing a semiconductor substrate 100, according to embodiments. The substrate 100 preferably is a bulk Si substrate or a silicon-on-insulator substrate (SOI). A SOI substrate is a layered silicon-insulator-silicon substrate comprising a buried oxide (BOX) layer sandwiched in between a Si support layer and a Si device layer. The nanowire semiconductor device is manufactured in the Si device layer, which is the top layer of the SOI substrate. The Si support layer is the bottom layer of the SOI substrate. The SOI substrate may be manufactured using techniques commonly known by a person skilled in the art such as wafer bonding or separation by implantation of oxygen (SIMOX).

The disclosure will now be explained with reference to a bulk semiconductor substrate. However, it will be understood that any of the substrates described above can be used. The substrate comprises a main surface 111 which may also be referred to as the top surface, being the primary surface of the substrate.

After providing the semiconductor substrate 100 a vertical stack 1100 of alternating nanowires 1101,1102 and interlayer nanowires 1103 is provided on the main surface 111 of the substrate 100, each horizontal interlayer nanowire being positioned or sandwiched in between and in direct contact with two horizontal nanowires (FIG. 3). The lowest layer of the stack 1100 (in contact with the main surface 111 of the substrate) is preferably an interlayer nanowire. The interlayer nanowires 1103 are sacrificial or sacrificial nanowires which will be removed and at least partially be replaced by the gate stack later in the process flow.

The stack 1100 may be provided using processing steps known by a person skilled, such as for example an STI-first or an STI-last integration flow. This may comprise first patterning sacrificial fins in the semiconductor substrate and forming shallow trench isolation (STI) regions in between the sacrificial fins. Thereafter the fins may be recessed and the stack 1100 may be provided by alternating deposition of nanowire material 101 and interlayer nanowire material 103 in the recess. Deposition may be done by known deposition techniques such as chemical vapor phase deposition (CVD). The depth of the fin recess will determine the substrate thickness and the number of nanowire transistors stacked in the recess. The nanowire dimensions (such as width and thickness) can be tuned, but the length of the nanowires should preferably be smaller than 40 nm.

It is an objective of the present disclosure to provide a simplified integration flow for a more compact GAA-device, which means increasing the transistor density on a small footprint. It is an objective to provide a method for manufacturing a GAA-device comprising nanowires comprising different materials and/or different conductive types (i.e. n-type nanowire transistors and p-type nanowire transistors) in the same stack of nanowires.

According to embodiments the nanowire and the interlayer nanowire comprise a different material as the interlayer nanowire will be removed later in the process flow. The interlayer nanowire should thus comprise a material which may be etched selective to the material of the nanowire. According to embodiments the nanowire material 101 comprises preferably Si and the interlayer nanowire material may comprise $SiGe_{1-x}$ with $0<x<=1$.

Figure 4:
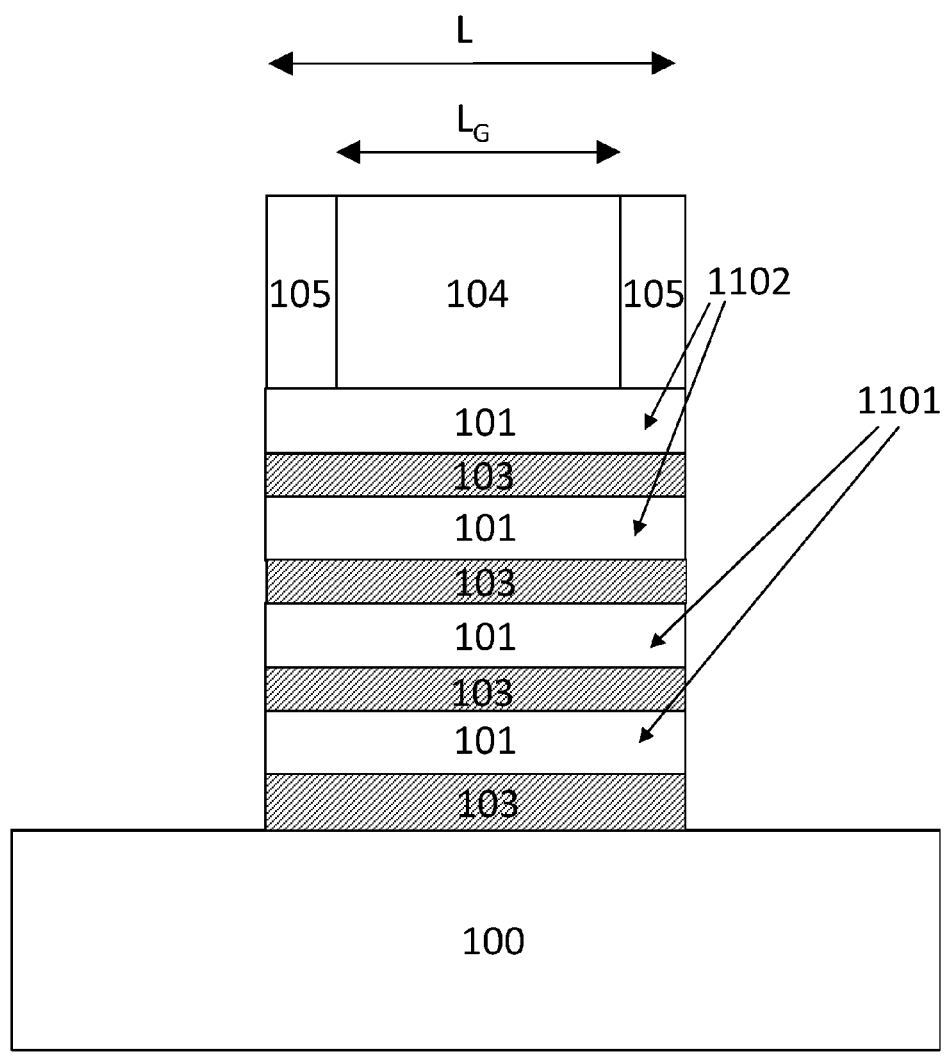

Referring to FIG. 4, after providing the stack of nanowires 1100, a sacrificial gate 104 and gate spacers 105 aside the sacrificial gate are provided on the stack of nanowires, thus on the top layer of the vertical stack of nanowires, according to embodiments. Providing the sacrificial gate 104 may comprise depositing a sacrificial gate material and patterning the material to form the sacrificial gate 104. The sacrificial gate material may be a semiconductor material, e.g., polycrystalline silicon, or a dielectric material, e.g., silicon nitride. In some embodiments, the sacrificial gate material is selected to be a material that is not an oxide or an oxide-based material (not $SiO_2$, for example), as to prevent down-diffusion during the following process steps (SiGe condensation). It is an advantage of using a sacrificial gate material which is not an oxide or an oxide-based that down-diffusion of oxygen (which is not present) is prevented and the annealing (Ge condensation) process further in the process flow is optimized. The spacers 105 may comprise any material suitable for a person skilled in the art, such as for example SiN, airgap.

Using the sacrificial gate 104 and spacers 105 as a mask, the stack of nanowires 1100 is thereafter patterned (FIG. 4). The resulting length L (which is thus parallel to the longitudinal direction) thereby defined determines the final length of the nanowires. This length L is preferably smaller than 40 nm in order to ensure complete conversion of the nanowires as will be explained further in the description. The spacers 105 are spaced apart with a distance equal to the gate length $L_G$.

In the final device (as is already explained before) two types of transistors are be present. These two type of transistors preferably differ in channel material (such as for example Si and SiGe transistor) and may also differ in conductive type (i.e. n- and p-type transistor). Each nanowire (which forms part of a transistor) comprises a channel region and may also comprise a source region and a drain region 121, 122. Alternatively the source and drain region 121, 122 may be arranged at both ends of the nanowires (and thus not forming part of the nanowire). The channel region may be undoped, lowly doped, i.e. with a doping concentration in a range of $1e12/cm^3$ to $1e15/cm^3$ or even highly doped in case of a junction-less transistor, i.e. with a doping concentration in a range of $1e19/cm^3$ to $1e20/cm^3$.

In the vertical stack 1100 of nanowires, some of the nanowires are to be selectively converted to form a second-type of nanowire 1102 (a substack of second-type nanowires) and some of the nanowires are not to be converted forming a first-type of nanowire 1101 (a substack of first-type nanowires). Thus, by selectively converting some nanowires, a first set of not-converted nanowires (referring also to first-type nanowire 1101) a second distinct set of converted nanowires (referring also to second-type nanowire 1102) are formed and defined. In the final device, as already described before, the substack of first-type nanowires 1101 comprises at least one nanowire comprising a first material 101 and the substack of second-type nanowires 1102 comprises at least one nanowire comprising a second material 160, being different from the first material 101. The material 101 of the nanowires intended to form the second set (second-type) 1102 of nanowires will be converted into the second material 160 thereby resulting in the final second-type nanowires of the semiconductor device. The first material of first set 1101 of nanowires will remain substantially unchanged during the further process steps (except for possible doping). This means the first set 1101 of nanowires as formed after providing the patterned structure already define the final (first) nanowires of the final device. The final device thus at least comprises a nanowire from the first set of nanowires 1101 and a nanowire from the second set 1102 of nanowires.

In converting the second set of nanowires, the first material 101 of the nanowire(s) intended to form the second set of nanowires is converted into another second material 160. This conversion involves some different process steps which will be explained further in detail.

Figure 5:
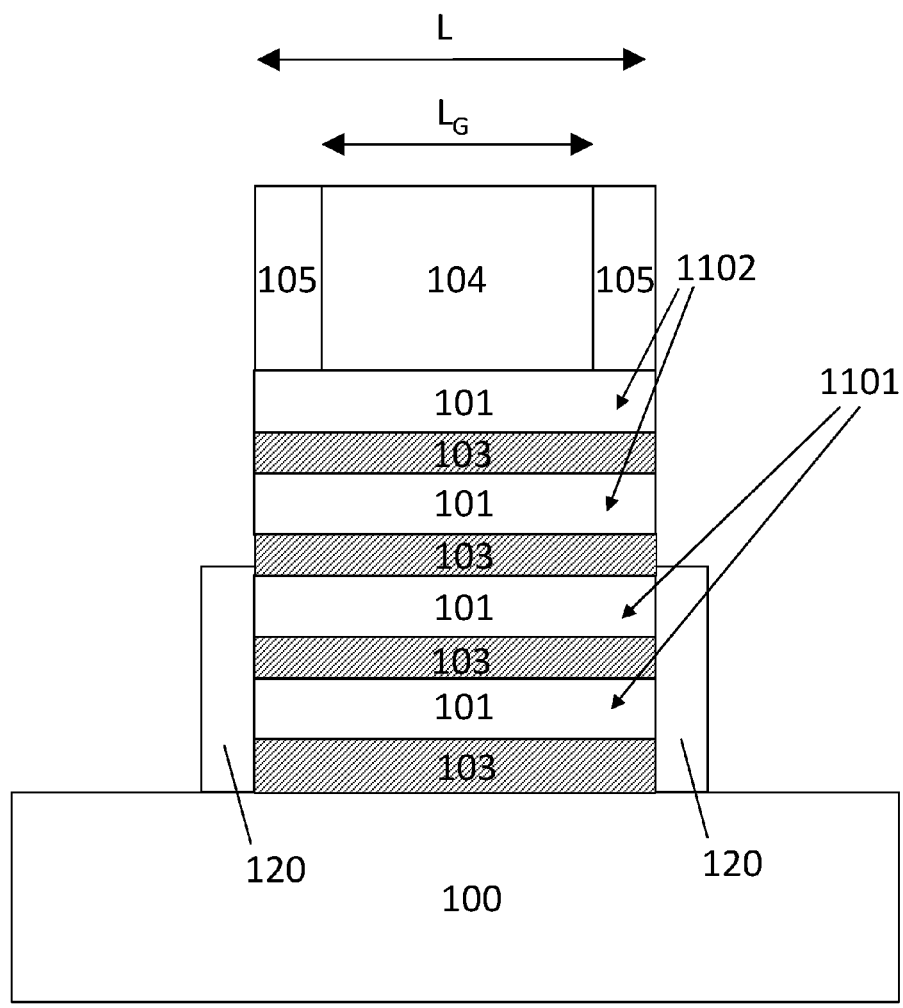

Referring to FIG. 5, the first set 1101 of nanowires are kept substantially unchanged during the further process steps and thus protected, according to embodiments. This is done by encapsulation of the first set 1101 of nanowires. A spacer layer 120 is deposited aside the first set 1101 of nanowires (i.e. aside and in contact with the nanowires and the interlayer nanowires which are still present) of the vertical stack of nanowires. The spacer layer 120 may comprise for example SiN or other materials known for a person skilled in the art which are commonly used as spacers. The spacer layer material should be different from the first or second material and preferably is not oxygen-based. The spacer material 120 will thus prevent conversion of the first material 101 of the first set 1101 of nanowires. The spacer material 120 furthermore ensures anchoring of the first set 1101 of nanowires.

Providing the spacer layer 120 may comprise first providing the spacer layer along the whole height of the stack of nanowires, i.e. along the side of both the first set 1101 and second set 1102 of nanowires and thereafter removing the spacer layer which is present along the sidewall of the second set 1102 of nanowires. Removing of the spacer layer which is present along the sidewall of the second set 1102 of nanowires may be done by conventional etching techniques which will simultaneously also remove any possibly formed native oxide at the sidewall.

Figure 6:
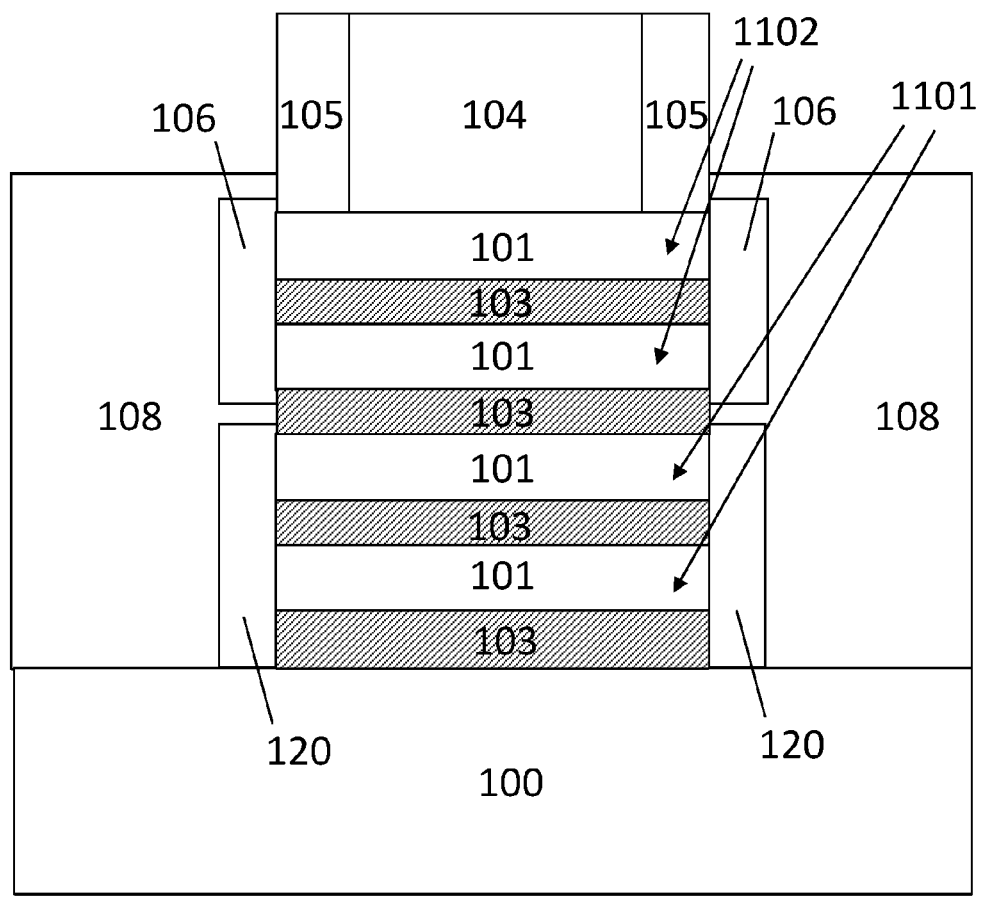

Referring to FIG. 6, after encapsulation of the first set 1101 of nanowires a conversion material 106, which can also be referred to as an alloying material or a diffusing material, is provided at the sides (i.e. at both ends) of the nanowires intended to form the second set 1102 of nanowires, according to embodiments.

The conversion material 106 is different from the first material 101 of the nanowires. The conversion material 106 is chosen such that it enables conversion, e.g., alloying or mixing, of the first material 101 (as will be explained further below). The conversion material 106 preferably comprises $SiGe_y$ with $0<y<=1$. The concentration of Ge in the conversion material 106 should preferably be different than the Ge concentration of the interlayer nanowires 103 because of etch selectivity.

The conversion material 106 may be provided aside and in contact of the nanowires (intended to form the second-type nanowires 1102) and also the interlayer nanowires 103 (FIG. 6) or only aside and in contact with the nanowires (intended to form the second-type nanowires 1102) (FIG. 7), according to different embodiments. Deposition techniques such as epitaxial growth (for the option shown in FIG. 6) or selective epitaxial growth (SEG) (for the option shown in FIG. 7). The conversion material 106 being present aside both the nanowires (intended to form the second-type nanowires 1102) and interlayer 103 nanowires or only aside of the nanowires (intended to form the second-type nanowires 1102) depends on different parameters. Depending on the Ge concentration in the conversion material 106 and the Ge concentration in the first material 101, the conversion material 106 will grow only on the side of the nanowires (intended to form the second-type nanowires 1102) or on both the sides of the nanowires (intended to form the second-type nanowires 1102) and the interlayer nanowires 103. Also a pre-epi cleaning step of the side of the nanowires (intended to form the second-type nanowires 1102) may influence whether the conversion material 106 will grow only on the side of the nanowires (intended to form the second-type nanowires 1102) or also on the interlayer nanowires 103.

According to embodiments the conversion material 106 may be provided only at one side of the nanowires (intended to form the second-type nanowires 1102). This has the advantage of the possibility to form an asymmetric nanowire device where only a left part or a right side part of the nanowire (intended to form the second-type nanowires 1102) is converted into the second material 160. This may be advantageous for example for tunnel FET devices which have opposite conductive types for source and drain regions.

When selective epitaxial growth (SEG) (for the option shown in FIG. 7) is used for forming the conversion material 106, a void 107 is created between the grown conversion material 106 of adjacent nanowires 101. This ensures a better oxygen control in one of the further steps of converting the first material 101 into the second material 160.

As the first set 1101 of nanowires are encapsulated, the conversion material 106 is not formed aside or in contact with this set 1101 and will thus also not influence the first material of the nanowires 101 in this set 1101 in the further steps of the method (more specifically the step of converting the first material). The conversion material 106 is thus selectively provided at the ends of the nanowires (intended to form the second-type nanowires 1102), which means the conversion material 106 is only provided at the ends of the nanowires which are to be converted and not provided at the ends of the other nanowires which are not to be converted.

Figure 7:
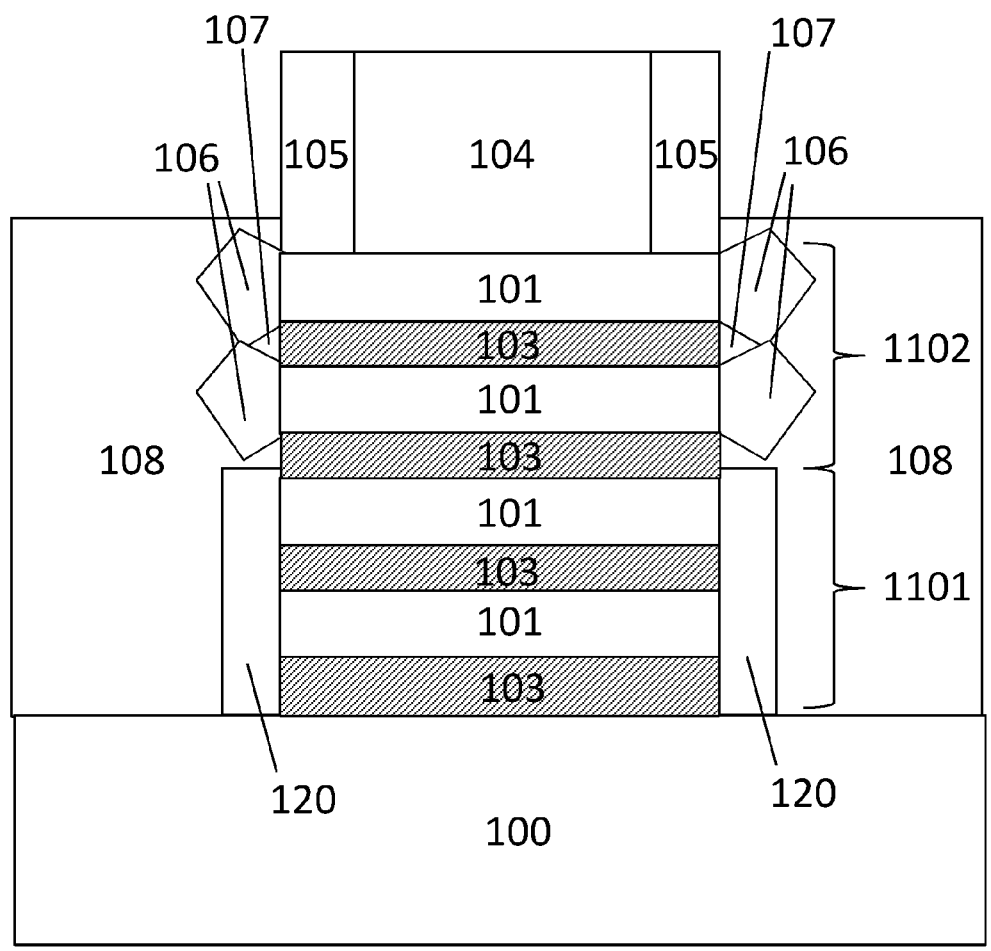

After providing the conversion material 106 a dielectric material 108 is provided to encapsulate the intermediate device (FIG. 7). This dielectric layer 108 also protects the substrate, the nanowires, the second channel material and the spacer layer during the following process steps. The dielectric material 108 comprises an oxide such as $SiO_2$ which is important for the conversion step (more specifically to diffuse to oxygen during the Ge condensation process (which is explained further).

Figure 8:
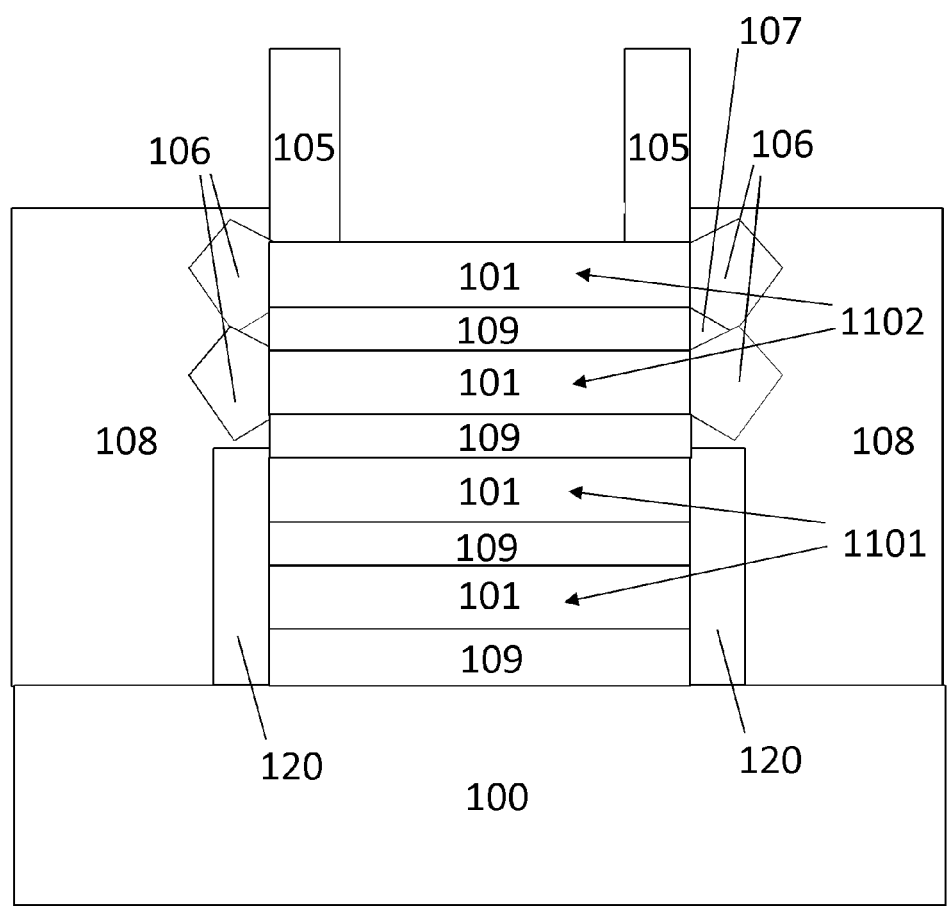

Referring to FIG. 8, in a next step the sacrificial gate 104 and the interlayer nanowires 103 are removed, according to embodiments. This may be done in a simultaneous step, but most probably in different steps as the sacrificial gate 104 and the interlayer nanowires 103 preferably comprise a different material. Standard etching techniques may be used to remove the sacrificial gate 104 and the interlayer nanowires 103.

Where according to embodiments the conversion material 160 is present on both the nanowires intended to form the second-type nanowires and the interlayer nanowires (as in FIG. 6) and where the conversion material 106 and the interlayer nanowires 103 both comprise SiGe, the etch chemistry for removing the interlayer nanowire 103 should be adapted such that the conversion material 106 is not removed or etched away (during removal of the interlayer nanowires). The etching chemistry should thus be selective to the material of the interlayer nanowires 103.

According to embodiments the cavities 109 formed in between the nanowires 1101, 1102 by removing the interlayer nanowires 103 may be refilled by an oxygen-free layer to better anchor the nanowires (not shown) and as such prevent wiggling of the nanowires in further process steps.

Figure 9:
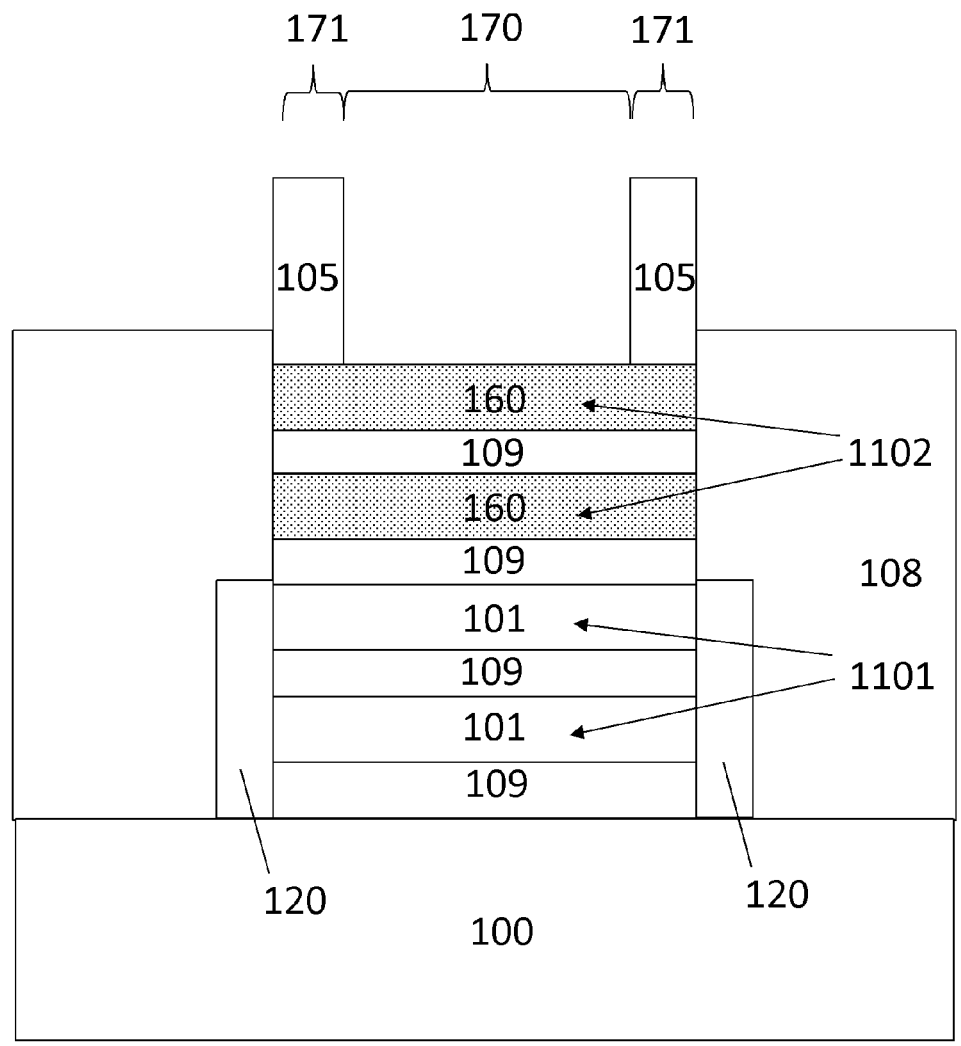

Referring to FIG. 9, after removing the sacrificial gate 104 and the interlayer nanowires 103, the first material 101 of the nanowires intended to form the second set 1102 of nanowires is converted into the second material 160, according to embodiments. This process step involves driving in the species of the conversion material 106 into the nanowires 1102. According to embodiments, Si nanowires may be converted substantially entirely into SiGe nanowires.

According to embodiments, without being bound to any theory, a Ge-condensation process may at least partially cause the conversion of the first material 101 of nanowires intended to form the second set 1102 of nanowires. The Ge-condensation process can include an oxidation process. The oxidation process is done by annealing the intermediate device. The Ge-condensation method according to embodiments based on the selective or preferential oxidation of Si atoms (over Ge-atoms) of the conversion material 106 (comprising SiGe) and thus forming $SiO_2$. Due to the formation of $SiO_2$ and the non-diffusivity of Ge in $SiO_2$, Ge atoms diffuse into the SiGe/Si interface into the nanowires 1102 and form there a SiGe nanowire (by thus partially or completely converting the nanowires 1102 comprising Si into SiGe). The concentration of Ge (the second material 160) in the converted nanowires 1102 will be higher than the Ge-content of the conversion material 106.

Figure 10:
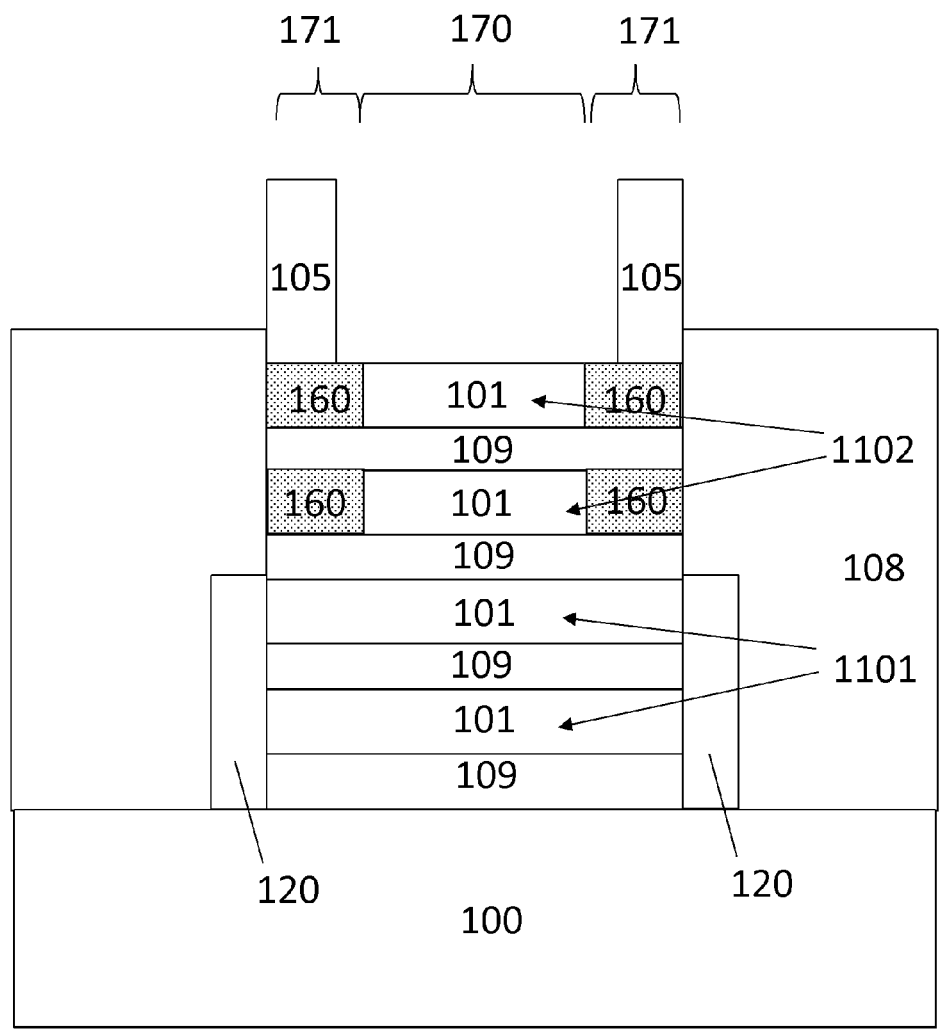

According to embodiments the nanowires intended to form the second set of nanowire 1102 are partially or completely converted, as has been described already in detail before. FIG. 9 schematically shows a complete conversion of the nanowires intended to form the second type of nanowires 1102, whereas FIG. 10 schematically shows a partial conversion. As also described before depending on the conversion the channel region of the nanowires may cover the complete nanowire 1102 or only inner part of the nanowire 170.

The annealing is done at a temperature of about 800 degrees Celsius for a period of about 60 minutes in a dry oxygen ambient. Depending on the need for a complete or a partial conversion of the nanowires intended to form the second-type nanowires 1102, the annealing parameters may be varied and adapted for different implementations.

During the conversion step also top part 100a of the semiconductor substrate 100 may be influenced and converted into a semiconductor oxide material. For example if the semiconductor substrate comprises Si, the top part 100a of the substrate will be converted into $SiO_2$ due to the annealing/oxidation step.

The conversion material 106 is preferably completely consumed after the Ge condensation step. It may happen that some conversion material 106 is left at the sides (due to incomplete Ge condensation), however this remaining conversion material 106 will be removed prior to providing the final source and drain regions 121,122 of the second-type nanowires 1102.

After the conversion step, the final source and drain regions 121, 122 (which may involve a doping step at the side of the device) and respective source 131, drain 132 and gate contacting of the device may be formed according to process steps known for a person skilled in the art resulting in a nanowire device according to the disclosure as shown in FIG. 1 and/or FIG. 3. This involves removing the dielectric material 108 and optionally anchoring the nanowires with inner spacers 190.

In the embodiments described above, apparatuses and methods for nanowire-based devices are described in connection with particular embodiments. It will be understood, however, that the principles and advantages of the embodiments can be used for any other systems, apparatus, or methods with a need for nanowire-based devices. In the foregoing, it will be appreciated that any feature of any one of the embodiments can be combined and/or substituted with any other feature of any other one of the embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All suitable combinations and subcombinations of features of this disclosure are intended to fall within the scope of this disclosure.

What is claimed is:

1. A method of fabricating a semiconductor device, the method comprising:
    providing a semiconductor substrate having a main surface;
    forming on the main surface a vertical stack comprising nanowires formed of a first material and interlayer nanowires formed of an interlayer material different from the first material, wherein the nanowires and the interlayer nanowires alternate in a vertical direction and laterally extend in a longitudinal direction parallel to the main surface, wherein the nanowires have two ends at opposite sides of the nanowire and an inner part therebetween in the longitudinal direction, wherein the inner part has two sides and an outer part at each side in the longitudinal direction, and wherein the nanowires include a first conductivity type nanowire and an intermediate second conductivity type nanowire configured to be converted to a second conductivity type nanowire;
    selectively providing at at least one of two ends of the intermediate second conductivity type nanowire a conversion material different from the first material and configured to convert the first material of the intermediate second conductivity type nanowire into a second material;
    removing the interlayer nanowires;
    after removing, converting the first material of at least one of the two outer parts of the intermediate second conductivity type nanowire into the second material, thereby converting the intermediate second conductivity type nanowire into the second conductivity type nanowire, wherein the first material of the first conductivity type nanowire remains unconverted; and
    forming a shared gate structure around the first conductivity type and second conductitivy type nanowires.

2. The method according to claim 1, wherein selectively providing comprises selectively providing at both of the two ends of the intermediate second conductivity type nanowire and converting the first material of both of the two outer parts of the second conductivity type intermediate nanowire.

3. The method according to claim 1, further comprising:
    before removing the interlayer nanowires, providing at the two ends of the first conductivity type nanowire a spacer material.

4. The method according to claim 1, wherein converting the first material of the intermediate second conductivity type nanowire into the second material comprises annealing.

5. The method according to claim 1, wherein the first material comprises silicon, the conversion material comprises $SiGe_x$, wherein y is greater than zero and less than or equal to one, and the second material comprises $SiGe_z$, where y is greater than zero and less than or equal to one and less than y.

6. The method according to claim 1, further comprising, after removing the interlayer nanowires and prior to converting the first material, anchoring the nanowires with inner dielectric spacers.

7. The method according to claim 2, further comprising:
    fabricating a source region at one of the two ends of the first conductivity type nanowire and a drain region at the other of the two ends of the first conductivity type nanowire; and
    fabricating a source region at one of the two ends of the second conductivity type nanowire and a drain region at the other of the two ends of the second conductivity type nanowire.

8. The method according to claim 3, further comprising:
    before removing the interlayer nanowires, encapsulating the vertical stack of nanowires, the spacer material and the conversion material with a dielectric material, the dielectric material comprising oxygen.

9. The method according to claim 4, wherein annealing comprises oxidizing the first material of the intermediate second conductivity type nanowire and intermixing of the conversion material into the first material, thereby forming the second material.

* * * * *

UNITED STATES PATENT AND TRADEMARK OFFICE
CERTIFICATE OF CORRECTION

PATENT NO. : 9,991,261 B2  
APPLICATION NO. : 15/221396  
DATED : June 5, 2018  
INVENTOR(S) : Jerome Mitard Page 1 of 1

It is certified that error appears in the above-identified patent and that said Letters Patent is hereby corrected as shown below:

On the Title Page

Column 1, Notice, Line 3, after "0 days." delete "days.".

In the Specification

Column 1, Line 31, change "advancedpatterning," to --advanced patterning,--.

Column 7, Line 43, change ""nanowire"" to --"nanowire"--.

Column 14, Line 67, change "FIG.7)." to --FIG. 7).--.

In the Claims

Column 17, Line 56, in Claim 1, change "at at" to --at--.

Column 18, Line 14 (approx.), in Claim 1, change "conductitivy" to --conductivity--.

Column 18, Line 30 (approx.), in Claim 5, change "$SiGe_x$, wherein" to --$SiGe_y$, where--.

Column 18, Line 32 (approx.), in Claim 5, change "y" to --z--.

Signed and Sealed this  
Eleventh Day of December, 2018

Andrei Iancu  
*Director of the United States Patent and Trademark Office*